United States Patent [19]

Kang

[11] Patent Number: 5,652,583
[45] Date of Patent: Jul. 29, 1997

[54] APPARATUS FOR ENCODING VARIABLE-LENGTH CODES AND SEGMENTING VARIABLE-LENGTH CODEWORDS THEREOF

[75] Inventor: Dong-Soo Kang, Seoul, Rep. of Korea

[73] Assignee: Daewoo Electronics Co. Ltd, Seoul, Rep. of Korea

[21] Appl. No.: 556,530

[22] Filed: Nov. 13, 1995

[30] Foreign Application Priority Data

Jun. 30, 1995 [KR] Rep. of Korea .................... 95-19183

[51] Int. Cl.$^6$ .................................................. H03M 7/40
[52] U.S. Cl. ............................................... 341/67; 341/60
[58] Field of Search ................................. 341/60, 67, 106

[56] References Cited

U.S. PATENT DOCUMENTS

| | | | |
|---|---|---|---|
| 4,963,867 | 10/1990 | Bertrand | 341/60 |
| 5,055,841 | 10/1991 | Cordell | 341/67 |
| 5,079,548 | 1/1992 | Fujiyama et al. | 341/67 |
| 5,162,795 | 11/1992 | Shirota | 341/67 |
| 5,321,398 | 6/1994 | Ikeda | 341/67 |
| 5,557,271 | 9/1996 | Rim et al. | 341/67 |
| 5,561,690 | 10/1996 | Park | 375/340 |

*Primary Examiner*—Marc S. Hoff
*Attorney, Agent, or Firm*—Anderson Kill & Olick P.C.

[57] ABSTRACT

An apparatus for encoding variable length codes (VLCs) represented by variable-length codewords and their lengths, and segmenting variable-length codewords of the VLCs into fixed-length segments for a transmission thereof, comprises: a lookup table for mapping each of source codes into each of the VLCs to produce each of the variable-length codewords and its length; a first barrel shifter, in response to the length of the present input variable-length codeword, for concatenating a present input variable-length codeword and a concatenated variable-length codeword together; a second barrel shifter, in response to a control signal, for producing a fixed-length segment out of combined inputs of the present input variable-length codeword and the concatenated variable-length codeword; an adder for adding the length of the present input variable-length codeword and an added length to produce a newly added length; and a register for comparing the newly added length with a predetermined number of bits to store the newly added length if the newly added length does not exceed a predetermined number of bits and, otherwise, to store a residue representative of the number of exceeding bits after the adding as the added length and to produce an output-available signal; and, in response to the enable signal, producing each stored added length as the second control signal of the second barrel shifter.

3 Claims, 4 Drawing Sheets

FIG. 2

| INPUT ORDER | SECOND REGISTER | THIRD REGISTER | FOURTH REGISTER | FIFTH REGISTER | SIXTH REGISTER | OUTPUT-AVAILABLE SIGNAL |
|---|---|---|---|---|---|---|
| 1 | 1000 0011 | 8 | | 0 | | 0 |
| 2 | 111X XXXX | 3 | 1000 0011 | 0 | 1000 0011 | 1 |
| 3 | 01XX XXXX | 2 | 0001 1111 | 3 | 111X XXXX | 0 |
| 4 | 1010 XXXX | 4 | 0111 1101 | 5 | 1110 1XXX | 0 |
| 5 | 001X XXXX | 3 | 1101 1010 | 1 | 1110 1101 | 1 |
| 6 | 110X XXXX | 3 | 1101 0001 | 4 | 0001 XXXX | 0 |

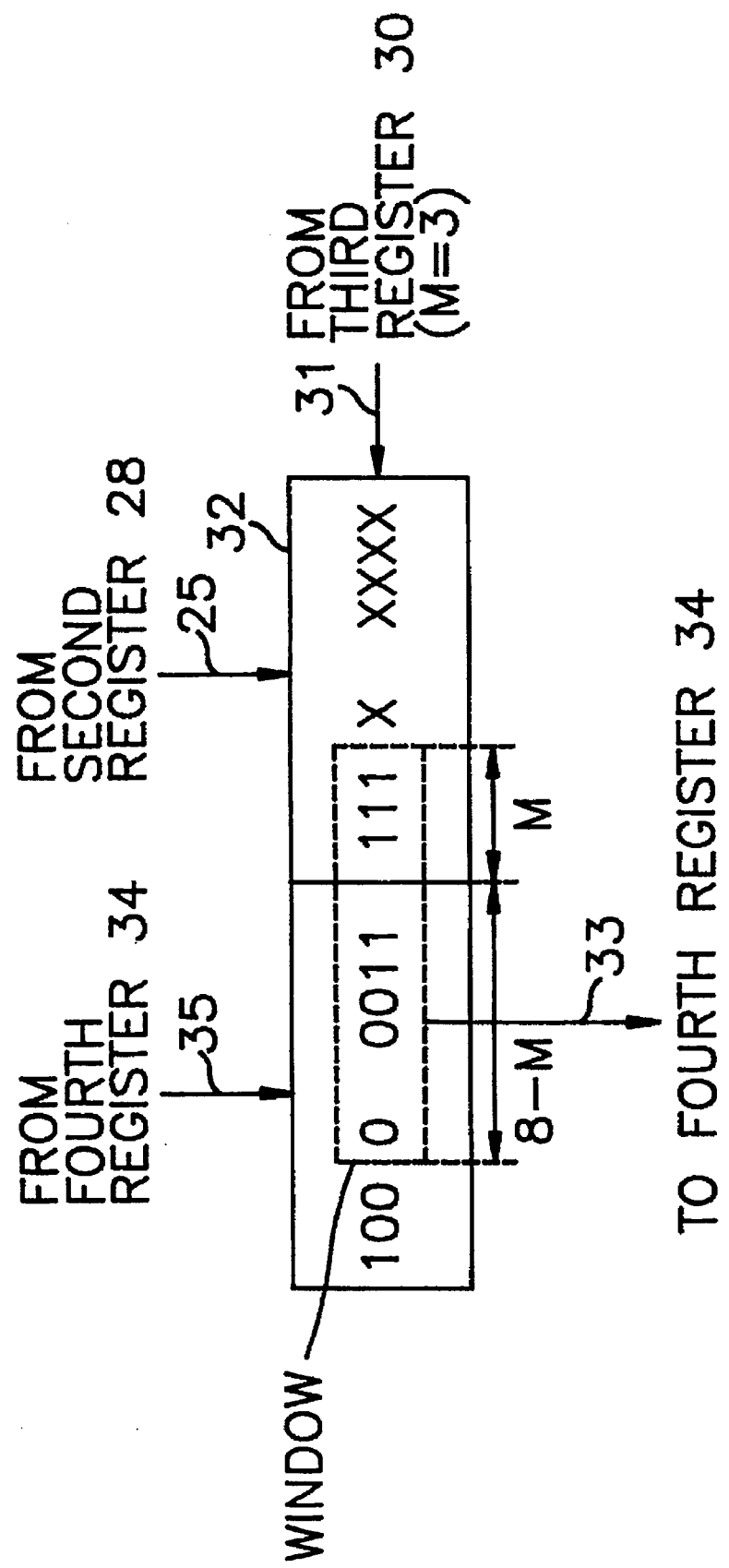

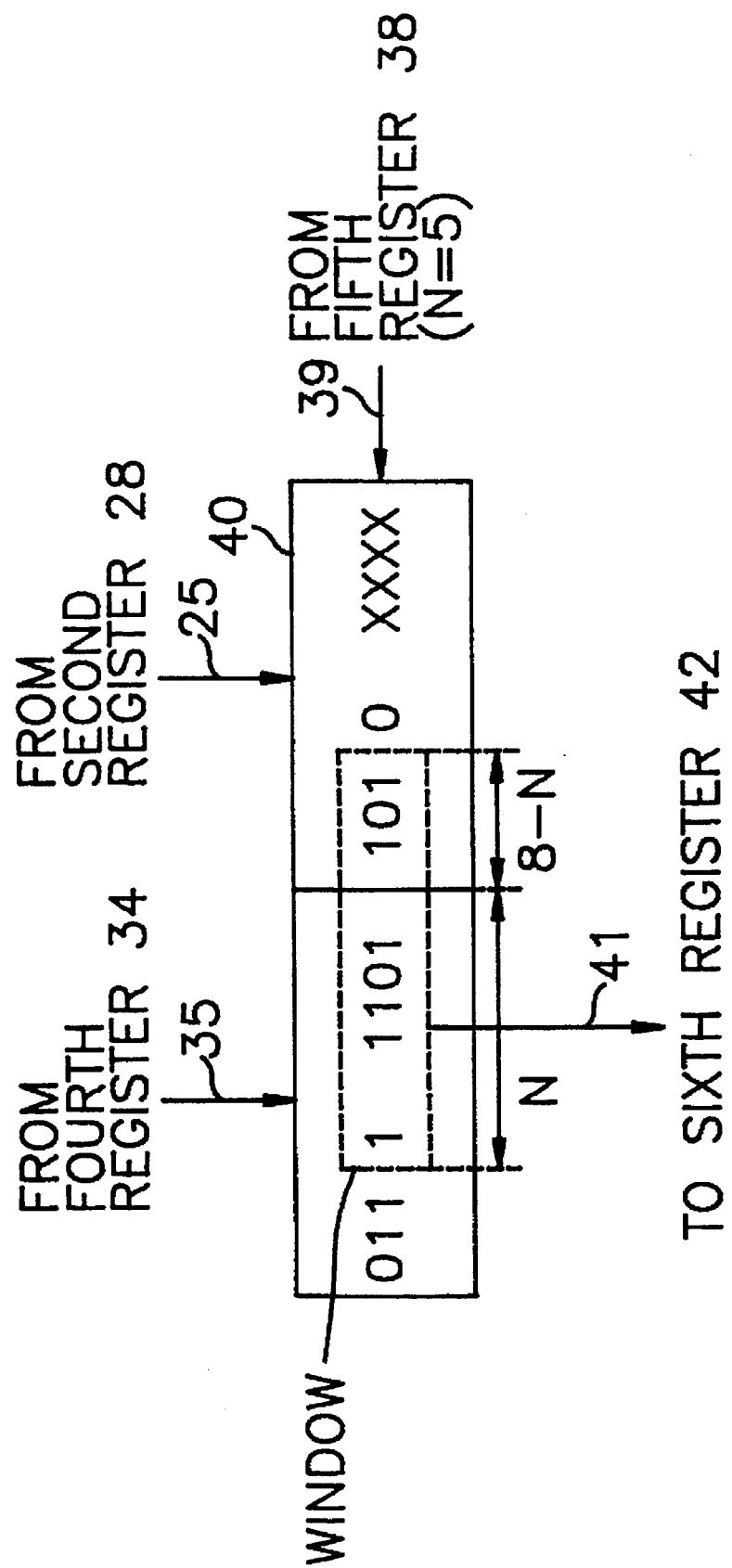

APPARATUS FOR ENCODING VARIABLE-LENGTH CODES AND SEGMENTING VARIABLE-LENGTH CODEWORDS THEREOF

FIELD OF THE INVENTION

The present invention relates to an apparatus for encoding variable length codes (VLCs) represented by variable-length codewords and their lengths, and segmenting variable-length codewords of the VLCs into fixed-length segments for the transmission thereof; and, more particularly, to a VLC encoding and segmenting apparatus which is capable of processing the length part of the VLCs in an encoded form.

DESCRIPTION OF THE PRIOR ART

Variable-length coding is a technique often used for lossless data compression. This technique is used to convert fixed-length data to variable-length codewords based on the statistical occurrences of the data. Each length of the variable-length codewords is chosen in such a manner that shorter codewords are used to represent more frequently occurring data and longer codewords to represent less frequently occurring data. By properly assigning the variable-length codewords to a library of all possible source data, the average word length of the variable-length codewords becomes shorter than that of the source data, thereby rendering it possible to achieve data compression.

In general, the encoding process of the VLCs represented by variable-length codewords and their lengths, and the segmenting process of the variable-length codewords of the VLCs for the transmission can be implemented by using a lookup table in which the variable-length codewords and their length data are stored as the contents thereof. A lookup table based VLC encoding and segmenting apparatus is disclosed in, e.g., Shaw-Min Lei et al., "An Entropy Coding System for Digital HDTV Applications", *IEEE Transactions on Circuits and Systems for Video Technology*, 1, No. 1, pp. 147-154 (March 1991). Some of the major circuit components of the VLC encoding and segmenting apparatus include a PLA (Programmable Logic Array) and three barrel shifters. The PLA is a lookup table which maps the input data to variable-length codewords to produce the VLCs, i.e., the variable-length codewords and their lengths. A first barrel shifter concatenates these variable-length codewords together based on each length of the variable-length codewords to provide a chain of variable-length codewords; and a second barrel shifter segments the chain of variable-length codewords into n-bit words for output; and a third barrel shifter accumulates each length of the variable-length codewords to generate a control signal which indicates whether the output of the VLC encoding and segmenting apparatus is available. Especially, the information on the lengths of the variable-length codewords produced from the PLA is supplied to the first and the third barrel shifters in a decoded form which means the position of the only 1 indicates the length. That is, if the maximum length of a variable-length codeword is sixteen, a set of 16-bit lines must be employed to represent each length of the variable-length codewords. The decoded form of the length of the variable-length codewords enables the third barrel shifter to rapidly produce a control signal of the second barrel shifter.

In the afore-described lookup table based VLC encoding and segmenting apparatus, however, since a hardware embodiment of the VLC encoding and segmenting apparatus must be provided with n-bits of data lines of a same width as the largest number of bits that a variable-length codeword can have, as the codeword length in bits desired increases, as does the size of the hardware embodiment, and, consequently, the cost as well. The problem becomes especially serious when far longer variable-length codewords need to be processed in their decoded forms.

SUMMARY OF THE INVENTION

It is, therefore, a primary object of the present invention to provide an improved VLC encoding and segmenting apparatus which is capable of processing the length of a variable-length codeword in an encoded form.

In accordance with the present invention, there is presented an apparatus for encoding VLCs represented by variable-length codewords and their lengths, and segmenting variable-length codewords of the VLCs into n-bit words for the transmission thereof, wherein the lengths of the variable-length codewrods are processed in an encoded form, the apparatus comprising: a first register for storing a series of source codes and producing each of the source codes in response to a enable signal which is associated with each input time of the source codes; a lookup table for mapping each of the source codes into each of the VLCs to produce each of the variable-length codewords and its length; a second register for storing each of the variable-length codewords, and, in response to the enable signal, for producing each stored variable-length codeword; a third register for storing each length of the variable-length codewords, and, in response to the enable signal, producing each stored length; a first barrel shifter, in response to a first control signal representative of the length of a present input variable-length codeword, for concatenating the present input variable-length codeword and a concatenated variable-length codeword together, thereby to produce a newly concatenated variable-length codeword; a fourth register for storing the concatenated variable-length codeword, and, in response to the enable signal, producing each concatenated variable-length codeword; a second barrel shifter, in response to a second control signal, for segmenting the combined inputs of the present input variable-length codeword and the concatenated variable-length codeword into n-bit words for output; an adder for adding the length of the present input variable-length codeword and an added length to produce a newly added length; a fifth register for comparing the newly added length with a predetermined number of bits to store the newly added length if the newly added length does not exceed a predetermined number of bits and, otherwise, to store a residue representative of the number of exceeding bits after the adding as the added length and to produce an output available signal which indicates whether the n-bit word stored in a sixth register is available; and, in response to the enable signal, producing each stored added length as the second control signal of the second barrel shifter; and the sixth register for storing the n-bit word from the second barrel shifter and, in response to the enable signal, producing the stored fixed-length segment.

BRIEF DESCRIPTION OF THE DRAWINGS

The above and other objects and features of the present invention will become apparent from the following description of preferred embodiments given in conjunction with the accompanying drawings, in which:

FIG. 2 provides an explanatory diagram for illustrating the operation of the VLC encoding and segmenting apparatus shown in FIG. 1;

FIG. 3 schematically shows a first barrel shifter for concatenating variable-length codewords; and FIG. 4 schematically illustrates a second barrel shifter for segmenting a chain of concatenated variable-length codewords.

DETAILED DESCRIPTION OF THE PREFERRED EMBODIMENTS

Figure 1:
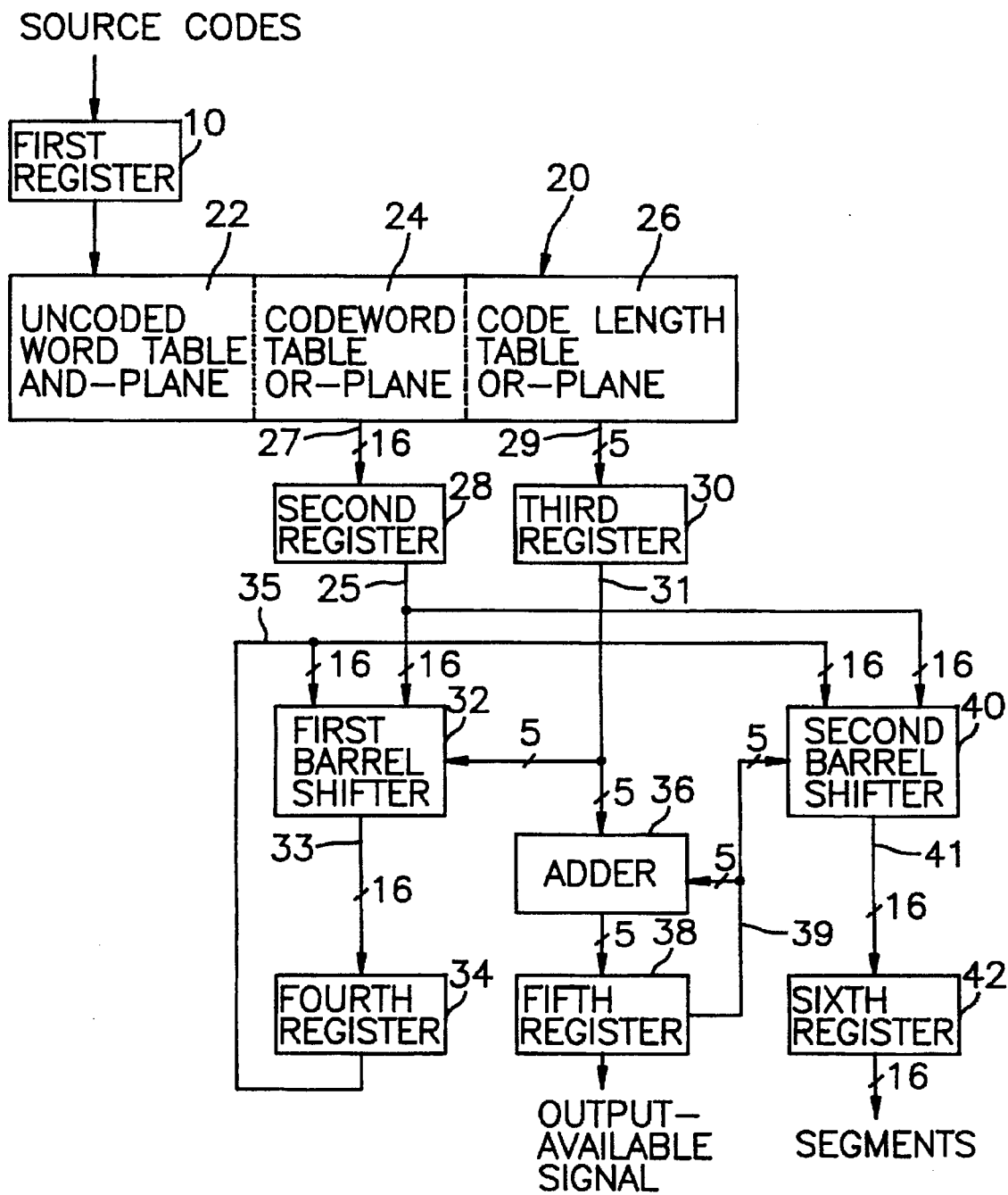
FIG. 1 represents a block diagram of a VLC encoding and segmenting apparatus in accordance with the present invention.

Referring to FIG. 1, there is shown a block diagram of a VLC encoding and segmenting apparatus in accordance with a preferred embodiment of the present invention. The VLC encoding and segmenting apparatus produces variable length codes (VLCs), represented by variable-length codewords and their lengths, concatenates them together and segments the concatenated bit-string into n-bit words for the transmission thereof. As shown in FIG. 1, a series of source codes is inputted to a first register 10. According to the MPEG (Moving Pictures Expert Group), for example, each of the source codes consists of a maximum run-length of 63 and a level ranging from −2047 to 2047. The term 'run-length' means the number of successive runs with a zero value, and the non-zero value following the successive zeros is called a level. The first register 10 sequentially stores the source codes which are derived by a RLC (Run-Length Coding) encoder and outputs them to a lookup table 20 in response to a enable signal which is associated with each input time of the source codes.

The lookup table 20 maps each of the source codes into a VLC to produce each variable-length codeword and its length corresponding to each of the source codes onto leads 27 and 29, respectively. In the preferred embodiment of the invention, the lookup table 20 is implemented by a programmable logic array (PLA). The lookup table 20 shown in FIG. 1 consists of an uncoded word table AND-plane 22, a codeword table OR-plane 24 and a code length table OR-plane 26. The lookup table 20 is described in Shaw-Min Lei et al., supra.

In particular, in the preferred embodiment of the invention, since the length of the variable-length codeword is processed in an encoded form, if a variable-length codeword has a maximum of 16-bit length, the length can be represented using 5 bits because the value of a codeword length ranges from 1 to 16. Each of the variable-length codewords from the codeword table 24 and its length from the code length table 26 are provided to a second register 28 and a third register 30 via the lead 27 and the lead 29, respectively.

The second and the third registers 28 and 30 sequentially store each of the variable-length codewords from the codeword table 24 and each corresponding length of the variable-length codewords from the length table 26, respectively; and output each of the stored variable-length codewords and each of the stored lengths in response to the above-described enable signal, respectively.

The 16-bits stored in the register 28 are inputted to a first and a second barrel shifters 32 and 40 over parallel leads 25. As will be described below, another 16-bits in a fourth register 34 are also inputted to the first and the second barrel shifters 32 and 40 over parallel leads 35. The first barrel shifter 32 is responsive to a codeword length signal on a lead 31 generated by the third register 30, to form a 16-bit window on its 32-bit inputs. The 16-bit window is shiftable across the 32-bit inputs on leads 25 and 35 and its position is directly determined by the codeword length signal inputted through the lead 31. The codeword length signal indicates a shift of the 16-bit window between zero and fifteen.

If each bit is numbered as 0, 1, 2, ..., 31 from the leftmost bit, a codeword length signal of "M" indicates that the 16-bit window encompasses the Mth through (M+15)th bit on leads 25 and 35. After forming the window, the first barrel shifter 32 produces a 16 bit-string to the fourth register 34 via a lead 33. The fourth register 34 stores the bit-string produced by the first barrel shifter 32 and, in response to the enable signal, provides the stored bit-string to the inputs of the first and the second barrel shifters 32 and 40.

In the meantime, each of the lengths stored in the third register 30 is sequentially inputted to an adder 36 in response to the enable signal. The adder 36 serves to add the length of the present variable-length codeword to an added length stored in a fifth register 38. The fifth register 38, if a newly added length from the adder 36 does not exceed a predetermined positive integer value which represents the bit number of a segment for transmission, i.e., 16, stores the newly added length at the fifth register 38. Otherwise, the fifth register 38 stores a residue representative of the number of exceeding bits after the adding as the added length; and produces an output available signal which represents whether the bit-string stored in the sixth register 42 is an available n-bit word and, in response to the enable signal, produces each stored added length to the second barrel shifter 40.

The second barrel shifter 40 is responsive to the value of the added length stored in the fifth register 38 on a lead 39, to form a 16-bit window on its 32-bit inputs which are provided by both the leads 25 and 35. The 16-bit window is shiftable across the 32-bit inputs on leads 25 and 35 and its position is directly determined by the added length signal. The added length signal indicates a shift of the 16-bit window between zero and fifteen. According to an added length signal of "N", the 16 bit-window of the second barrel shifter 40 encompasses the (16-N)th through (31-N)th bit on leads 25 and 35. After forming the window, the second barrel shifter 40 produces a 16-bit string to a sixth register 42 via a lead 41. The sixth register 42 stores the 16-bit window output bit-string from the second barrel shifter 40 and produces the stored bits to a video buffer (not shown) in response to the enable signal. When the output available signal is produced at the fifth register 38, the bit-string from the sixth register 42 will be stored in the buffer which stores only available 16-bit words for the transmission thereof.

The operation of the VLC encoding and segmenting apparatus in FIG. 1 may be more readily understood with reference to an example shown in a tabular form in FIG. 2. It is assumed that the maximum length of the variable-length codewords is 8 bits.

The first column of FIG. 2 is made for each input order of following registers: the second register 28 for the variable-length codewords from the codeword table 24; the third register 30 for each corresponding length of the variable-length codewords stored in the second register 28; the fourth register 34 for storing the output segment of the first barrel shifter 32; the fifth register 38 for storing an added length from the adder 36; and the sixth register 42 for storing the output segment of the second barrel shifter 40. The last column of FIG. 2 is built for the output available signal which represents whether the output segment of the second barrel shifter 40 is available or not.

According to the inputting order in the first column, the six numbers of the variable-length codewords are sequentially produced as shown in the second column, and each length corresponding to each of the variable-length codewords is stored as shown in the third column. The marks of "X" contained in the second column represent entirely meaningless bits out of all bits of a segment provided from the codeword table 24.

In the fourth column of FIG. 2, there are depicted five number of output segments of the first barrel shifter 32 which concatenates the variable-length codewords by removing the meaningless bits of the segment from the second register 28. Referring to FIG. 3, there is schematically shown the operation of the first barrel shifter 32 for concatenating variable-length codewords, for example, in case of input order 2. As shown in FIG. 3, if a first 8-bit segment "111X XXXX" from the second register 28 and a second 8-bit segment "1000 0011" from the fourth register 34 are inputted over parallel leads 25 and 35, the first barrel shifter 32 is responsive to a codeword length signal "M", i.e., M=3, on the lead 31 produced at the third register 30, to form an 8-bit window on its 16-bit inputs. The position of the 8-bit window is determined by shifting the window by M bits from the lefthand side of the 16-bit inputs. That is, the selection of M bits out of the first segment "111X XXXX" from the left-hand side and another selection of (8-M) bits out of the second segment "1000 0011" from the right-hand side remove the five meaningless bits of the first segment "111X XXXX", thereby to concatenate the variable-length codewords. After forming the window, the first barrel shifter 32 produces an 8-bit window output segment "0001 1111" to the fourth register 34 via the lead 33.

In the fifth column of FIG. 2, the fifth register 38 stores an added length or a residue of an added length subtracted by eight. As described above, the adder 36 serves to add the length of the present variable-length codeword stored in the third register 30 to the previous added length stored in the fifth register 38. Thus, for instance, the value "1" in the input order 5 of the fifth register of FIG. 2 is a residue after summing and subtracting operations of two values "4" and "5" in the input order 4 of the third and the fifth registers: the value "4" is the length of the present variable-length codeword stored in the third register 30 and the value "5" is the previous added codeword length stored in the fifth register 38.

In the sixth column of FIG. 2, there are depicted five number of output segments of the second barrel shifter 40 which serve to segment a bit-string which consists of the concatenated variable-length codewords from the first barrel shifter 32 and the present variable-length codeword from the second register 28. Referring to FIG. 4, there is schematically shown the operation of the second barrel shifter 40 for segmenting the bit-string, for example, in case of input order 4. As shown in FIG. 4, if a first 8-bit segment "1010 XXXX" from the second register 28 and a second 8-bit segment "0111 1101" from the fourth register 34 are inputted over parallel leads 25 and 35, the second barrel shifter 40 is responsive to the added length or residue signal "N", i.e., N=5, on the lead 39 stored in the fifth register 38, to form an 8-bit window on its 16-bit inputs. The position of the 8-bit window is determined by shifting the window by (8-N) bits from the lefthand of the 16-bit inputs. That is, the selection of N bits out of the second segment "0111 1101" from the right-hand side and another selection of (8-N) bits out of the first segment "1010 XXXX" from the lefthand side produce an output segment "1110 1101" to be stored in the sixth register 42 via the lead 41.

In the last column of FIG. 2, the output-available signal of "1" is produced whenever the added length from the adder 36 exceeds 8, thereby to indicate whether the bit-string stored in the sixth register 42 is an available n-bit word.

While the present invention has been shown and described in connection with the preferred embodiments only, it will be readily apparent to those of ordinary skill in the art that many changes and modifications may be made without departing from the spirit and scope of the invention as defined in the appended claims.

What is claimed is:

1. An apparatus for encoding variable length codes (VLCs) represented by variable-length codewords and their lengths, and segmenting variable-length codewords of the VLCs into fixed-length segments for the transmission thereof, wherein the lengths of the variable-length codewrods are processed in an encoded form, the apparatus comprising:

a first register for storing a series of source codes and producing each of the source codes in response to a enable signal which is associated with each input time of the source codes;

a lookup table for mapping each of the source codes into each of the VLCs to produce each of the variable-length codewords and its length;

a second register for storing each of the variable-length codewords, and, in response to the enable signal, for producing said each stored variable-length codeword;

a third register for storing each length of the variable-length codewords, and, in response to the enable signal, producing said each stored length;

a first barrel shifter, in response to a first control signal representative of the length of a present input variable-length codeword, for concatenating the present input variable-length codeword and a concatenated variable-length codeword together, thereby to produce a newly concatenated variable-length codeword;

a fourth register for storing the concatenated variable-length codeword, and, in response to the enable signal, producing said each concatenated variable-length codeword;

a second barrel shifter, in response to a second control signal, for producing a fixed-length segment out of combined inputs of the present input variable-length codeword and the concatenated variable-length codeword;

an adder for adding the length of the present input variable-length codeword and an added length to produce a newly added length;

a fifth register for comparing the newly added length with a predetermined number of bits to store the newly added length if the newly added length does not exceed the predetermined number of bits and, otherwise, to store a residue representative of the number of exceeding bits after the adding as the added length and to produce an output available signal which represents the availability of the fixed-length segment of the second barrel shifter; and, in response to the enable signal, producing said each stored added length as the second control signal of the second barrel shifter; and a sixth register for storing the fixed-length segment from the second barrel shifter and, in response to the enable signal, producing said each stored fixed-length segment.

2. The apparatus of claim 1, wherein the first barrel shifter includes:

2N-bit input means for receiving a first N-bit data segment, representative of the concatenated variable-length codeword, at the lefthand side of the first barrel shifter, and receiving a second N-bit data segment, representative of the present input variable-length codeword, at the right-hand side of the first barrel shifter;

means for receiving the first control signal representative of the length of the present input variable-length codeword; and means for shifting a first N-bit window on the two received data segments by the length of the present input variable-length codeword from the lefthand side, thereby to produce a first N-bit segment representative of the newly concatenated variable-length codeword.

3. The apparatus in claim 2, wherein the second barrel shifter includes:

2N-bit input means for receiving the first N-bit data segment, representative of the concatenated variable-length codeword, at the lefthand side of the second barrel shifter, and receiving the second N-bit data segment, representative of the present input variable-length codeword, at the right-hand side of the second barrel shifter;

means for receiving the second control signal representative of the added length or the residue; and means for shifting a second N-bit window on the two received data segments by the quantity of N-bit minus the added length or the residue, thereby to produce a second N-bit segment representative of the fixed-length segment of the second barrel shifter.

* * * * *